US 6,693,798 B1

(12) United States Patent
Conn et al.

(10) Patent No.: US 6,693,798 B1
(45) Date of Patent: Feb. 17, 2004

(54) ELECTRONIC UNIT ENCLOSURE AND METHOD

(75) Inventors: Kevin D. Conn, Magnolia, TX (US); Daniel T. Thompson, Houston, TX (US); Kelly K. Smith, Spring, TX (US); Karl J. Dobler, Cypress, TX (US)

(73) Assignee: Hewlett-Packard Development Company, LP., Houston, TX (US)

( * ) Notice: Subject to any disclaimer, the term of this patent is extended or adjusted under 35 U.S.C. 154(b) by 0 days.

(21) Appl. No.: 10/434,619

(22) Filed: May 9, 2003

(51) Int. Cl.[7] .................................................. H05K 5/04
(52) U.S. Cl. ....................... 361/754; 361/797; 361/800; 361/801; 361/747
(58) Field of Search ................................ 361/754, 797, 361/724, 714, 800, 801, 759, 740, 732, 726, 747

(56) References Cited

U.S. PATENT DOCUMENTS

| | | |
|---|---|---|
| 5,338,214 A | 8/1994 | Steffes et al. |
| 5,793,614 A | 8/1998 | Tollbom |
| 6,118,668 A | 9/2000 | Scholder et al. |
| 6,208,523 B1 | 3/2001 | Bertolami et al. |
| 6,259,600 B1 * | 7/2001 | Talbot et al. ............... 361/687 |
| 6,267,614 B1 | 7/2001 | Good et al. |
| 6,301,099 B1 | 10/2001 | Felcman et al. |
| 6,307,742 B1 | 10/2001 | Diaz et al. |
| 6,381,146 B1 | 4/2002 | Sevier |
| 6,404,641 B1 | 6/2002 | Fisk et al. |
| 6,506,065 B1 * | 1/2003 | Castleman .................. 439/157 |

OTHER PUBLICATIONS

U.S. patent application Publication No. 2003/0117777 issued Jun. 26, 2003, for Blindmate Heat Sink Assembly of Franz et al.

\* cited by examiner

Primary Examiner—Randy Gibson
Assistant Examiner—Hung Bui

(57) ABSTRACT

Disclosed herein is an enclosure for mounting one or more electronic units to a substrate, such as a printed circuit board.

19 Claims, 7 Drawing Sheets

ELECTRONIC UNIT ENCLOSURE AND METHOD

BACKGROUND

Electronic components, such as computer central processing units, are often mounted to circuit boards. Since it is often desirable to replace electrical components, such components are typically mounted in a manner that allows them to be readily installed into and removed from the circuit board when desired.

An electronic component may, for example, be provided with a plurality of pins that engage corresponding receptacles formed in a socket on the circuit board. An interference fit may be provided between the pins and the receptacles. Once the component has been installed within the socket, this interference fit then tends to hold the pins within the receptacles and ensures that reliable electrical contact is established between the pins of the component and the receptacles of the socket.

In a manner as described above, an electronic component can be installed onto a circuit board merely by applying a force to the component, causing the pins of the component to enter the receptacles of the circuit board socket. Conversely, the component can readily be removed by applying an oppositely directed force thereto. Accordingly, the type of component arrangement described above typically allows an electrical component to readily be removed and installed without the need for tools.

One problem with the electronic unit mounting arrangement described above is that a significant level of force may be required to install and remove the electronic component relative to the socket of the circuit board. The level of force required to install an electronic component into a socket will generally increase with the physical size of the component and, more specifically with the number of pins provided on the component.

Electronic components may also be mounted to circuit boards using a type of socket in which a locking mechanism is provided such that the pins of the electronic component may easily be inserted into the socket receptacles when the locking mechanism is disengaged. After insertion, the locking mechanism may then be engaged in order to tightly secure the pins within the socket receptacles. The provision of such a locking mechanism is generally more typical with relatively larger components having a relatively larger number of pins where greater insertion forces would otherwise be encountered.

With both types of mounting arrangements discussed above, sudden physical movement can sometimes cause some or all of the pins of the electronic component to disengage from the receptacles of the circuit board socket. This movement can compromise the electrical connection between the component and the board and, accordingly, the performance of the component and of the system in which it is housed. Such physical movement may, for example, be caused if the computer or other device housing the circuit board is dropped or jarred in some manner.

SUMMARY

Disclosed herein is an assembly that may include an electronic board, an enclosure fixedly mounted relative to the electronic board and an electronic unit. At least a portion of the electronic unit may be in electrical contact with at least a portion of the electronic board. The electronic unit may be at least partially located within the enclosure and the enclosure may include a stationary portion and a movable portion that is movable relative to the stationary portion. At least one of the stationary portion and the movable portion may include a post and at least the other of the stationary portion and the movable portion may include a slot. The assembly may include at least a first operating condition and a second operating condition. In the first operating condition, the post may be engaged within the slot and the movable portion may apply a force to the electronic unit, urging the electronic unit toward the electronic board. In the second operating condition, the post may be disengaged from the slot and the movable portion may not be applying a force to the electronic unit.

Also disclosed herein is a method that may include providing an electronic board and providing an enclosure fixedly mounted relative to the electronic board. The enclosure may include a stationary portion and a movable portion that is movable relative to the stationary portion. The method may also include providing a post on at least one of the stationary portion and the movable portion and providing a slot in the other of the stationary portion and the movable portion. The method may further include locating an electronic unit at least partially within the enclosure and placing at least a portion of the electronic unit in electrical contact with at least a portion of the electronic board and causing the moveable portion to apply a force to the electronic unit by engaging the post within the slot.

DETAILED DESCRIPTION

Figure 1:
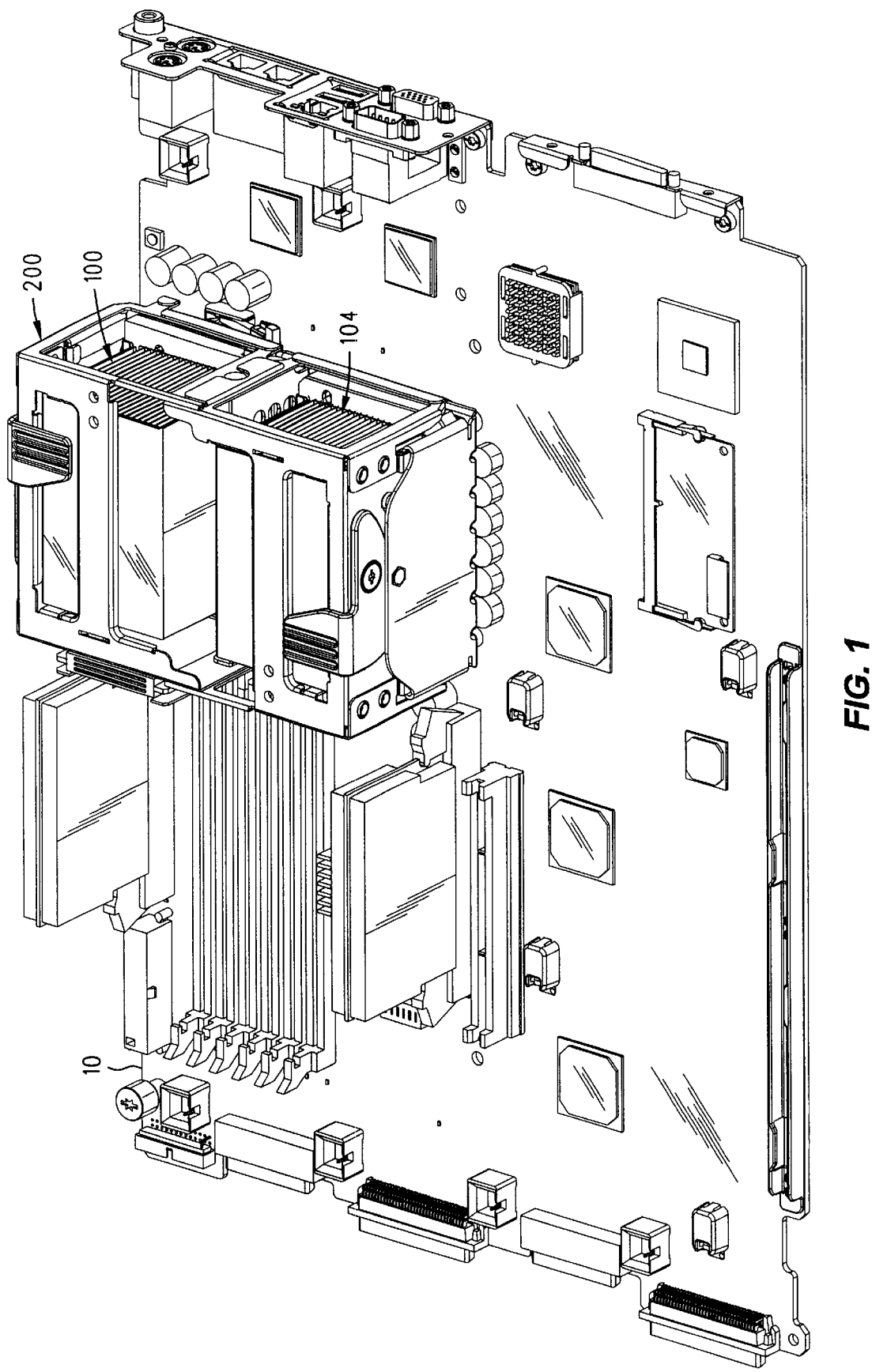
FIG. 1 is a top perspective view of an exemplary electronic unit enclosure mounted to an electronic board.

FIG. 1 generally illustrates a pair of electronic units 100, 104 mounted to an electronic board and at least partially enclosed within an enclosure 200.

As used herein, the term "electronic board" is intended to mean any type of substrate used for mounting electronic components and includes, for example, a printed circuit board such as the printed circuit board 10 shown in FIG. 1. Further, as used herein, the term "electronic component" is intended to mean any electronic device, for example, a central processing unit for a computing device such as, for example, a personal computer, workstation or server. The term "electronic unit" is intended to mean either an electronic component alone or an electronic component in conjunction with a heat removal device. The term "heat removal device", as used herein, is intended to mean any type of device used to remove heat from an electronic component and may, for example, include a heat sink, a fan-assisted heat sink or a heat pipe type heat transfer device.

It is noted that, for purposes of the description set forth herein, directional terms such as "up", "upwardly", "down", "downwardly", "front", "back", "side", "bottom", "lower", "top", "upper", "horizontal", "vertical" and the like are used for relative illustration purposes only and are not intended to denote any actual orientation of the enclosure 200 since in actual use, the enclosure described herein may be mounted in any position, thus making terms such as "up" and "down" relative to the orientation of enclosure.

Figure 7:
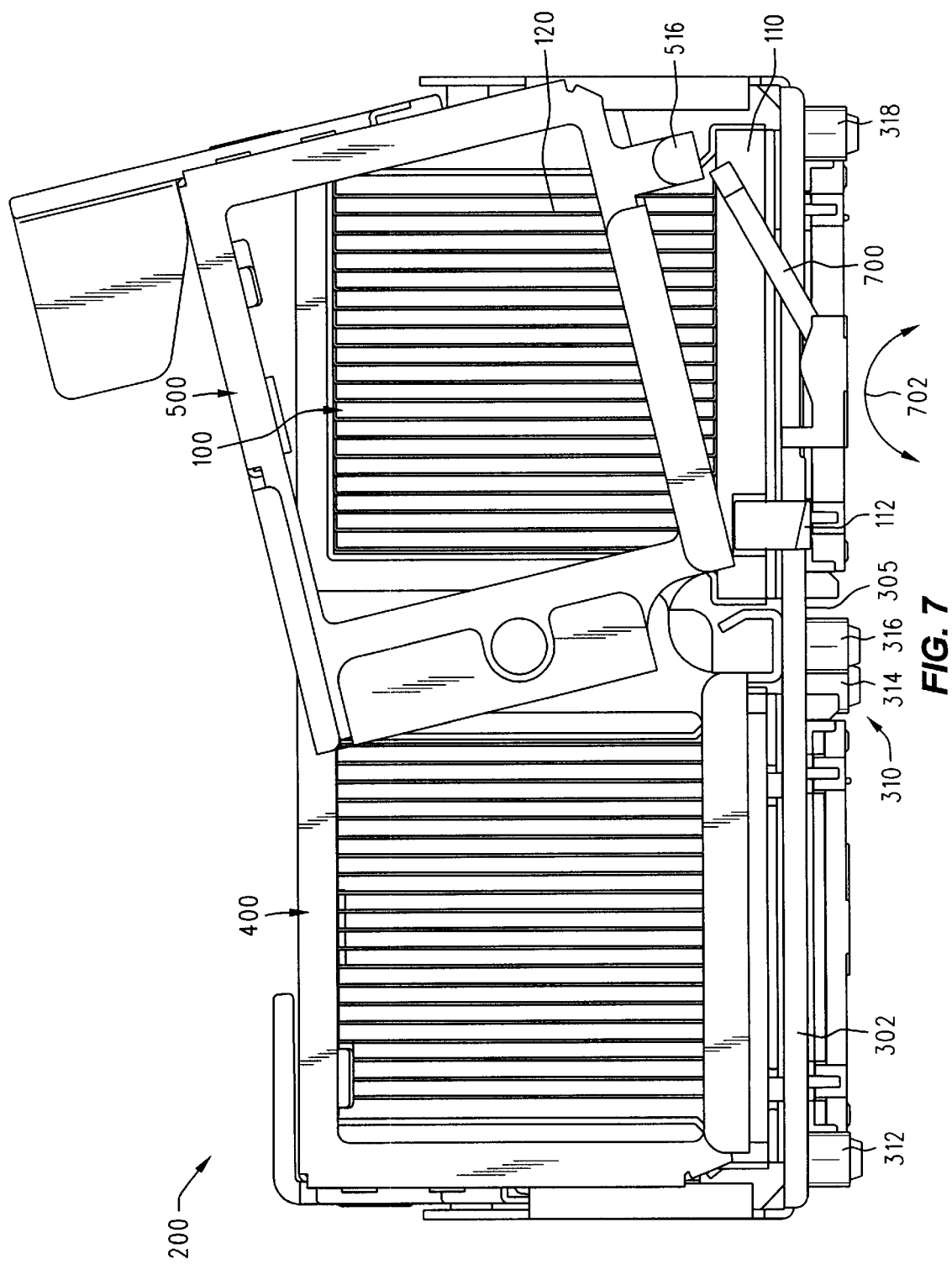
FIG. 7 is a front elevational view of the enclosure of FIG. 1 having electronic units housed therewithin and showing an error condition in which the enclosure cannot be moved to a closed condition.

Electronic units 100 and 104 may be substantially identical to one another, although they need not necessarily be identical. Accordingly, only the electronic unit 100 will be described in detail herein. With reference, for example, to FIG. 7, the electronic unit 100 is illustrated, for exemplary purposes only, as the type of electronic unit that includes both an electronic component, not shown, and a heat removal device 120 in conjunction therewith. With further reference to FIG. 7, the electronic component may, for example, be physically attached to the heat removal device 120 through the use of an alignment cage 110 such that the electronic component and heat removal device 120 can be handled as a single unit. The alignment cage 110 may include a tab 112 located thereon.

The electronic component may, for example, be a central processing unit for a computer and may, for example, include a plurality of pins, not shown, for engagement with a corresponding plurality of receptacles in a socket formed on the printed circuit board 10, FIG. 1. Heat removal device 120 may, for example, be a heat sink device provided to remove heat from the electronic component and dissipate the heat into the surrounding atmosphere.

Electronic unit 100 may, for example, be of the type disclosed in U.S. patent application Ser. No. 10/036,165, of John P. Franz and Wade David Vinson, filed Dec. 26, 2001, for BLINDMATE HEAT SINK ASSEMBLY, which is hereby specifically incorporated by reference for all that is disclosed therein.

With reference again to FIG. 1, as noted previously, the electronic unit 100 may be housed within an enclosure 200, as shown. As will be described in further detail herein, the enclosure 200 may serve to assist in applying the force necessary to install the electronic unit into the printed circuit board socket and to secure the electronic unit 100 in place once it is installed.

Figure 2:
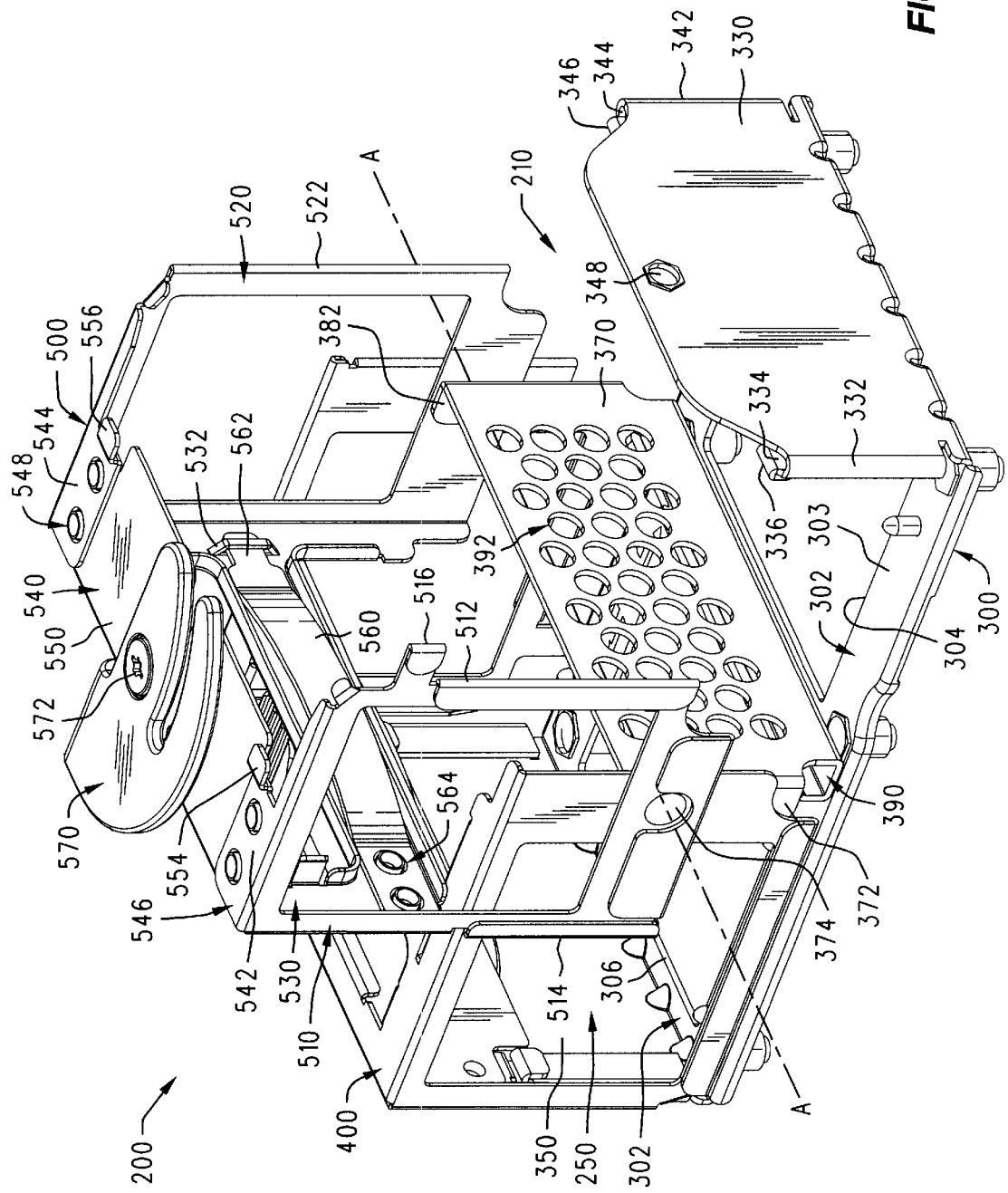
FIG. 2 is a top perspective view of the enclosure of FIG. 1 with one of the bays thereof in an open condition.
Figure 3:
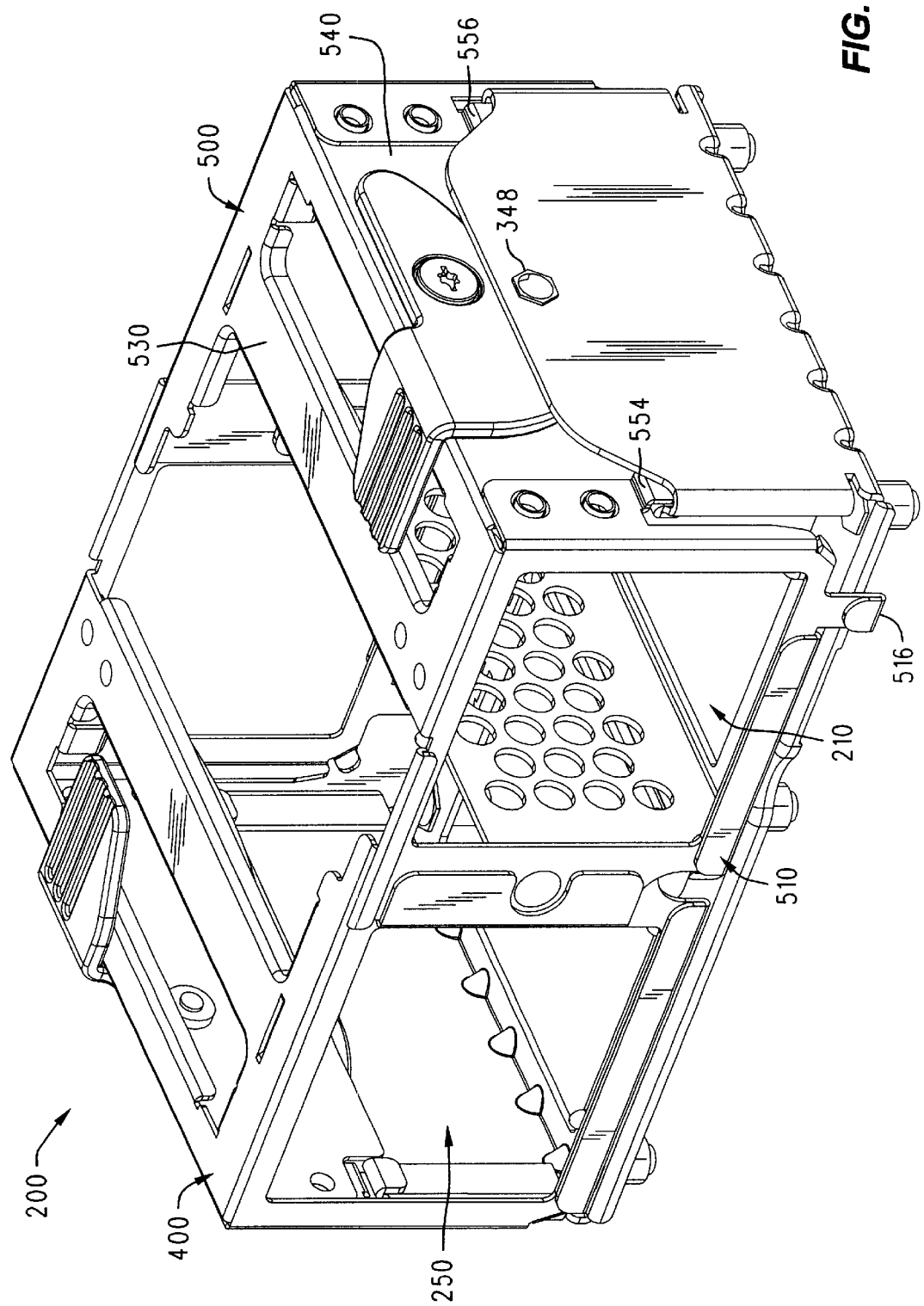
FIG. 3 is a top perspective view of the enclosure of FIG. 1 with both bays thereof in a closed condition.

With reference to FIGS. 2 and 3, the enclosure 200 may generally define a first bay 210 and a second bay 250, each of the bays being capable of receiving an electronic unit, such as the electronic unit 100 described above. In FIG. 1, the electronic unit 100 is shown housed within the bay 210 and the electronic unit 104 is shown housed within the bay 250. It is to be understood, however, that the enclosure 200 is described herein having two bays for the purposes of exemplary illustration only. The enclosure could, alternatively, be configured having only a single bay or having more than two bays.

Enclosure 200 may generally be formed from a base assembly 300 and two covers 400, 500, movably attached thereto (the cover 500 being shown in its open position in FIG. 2 and in its closed position in FIG. 3). Base assembly 300, in turn, may include a bottom plate 302, a pair of oppositely disposed sidewalls 330, 350 and a central wall 370.

Referring, for example, to FIG. 2, bottom plate 302 may, for example, be formed from sheet metal having a thickness of from about 0.032 inch to about 0.090 inch and, preferably, about 0.048 inch. Bottom plate 302 may include an upper surface 303 and an oppositely disposed lower surface 305, FIG. 7. A pair of openings 304, 306 may extend through bottom plate 302, as shown, for example, in FIG. 2. More specifically, the opening 304 may be located within the first bay 210 and the opening 306 within the bay 250 for purposes that will be described later herein. A plurality of foot members 310, such as the individual foot members 312, 314, 316, 318 illustrated in FIG. 7, may extend downwardly from the lower surface 305 of the plate member 302. Each of the foot members 310 may included a threaded bore therein, not shown, to facilitate attachment of the enclosure 200 to a printed circuit board such as the printed circuit board 10, FIG. 1, in a manner as will be described in further detail herein.

Figure 4:
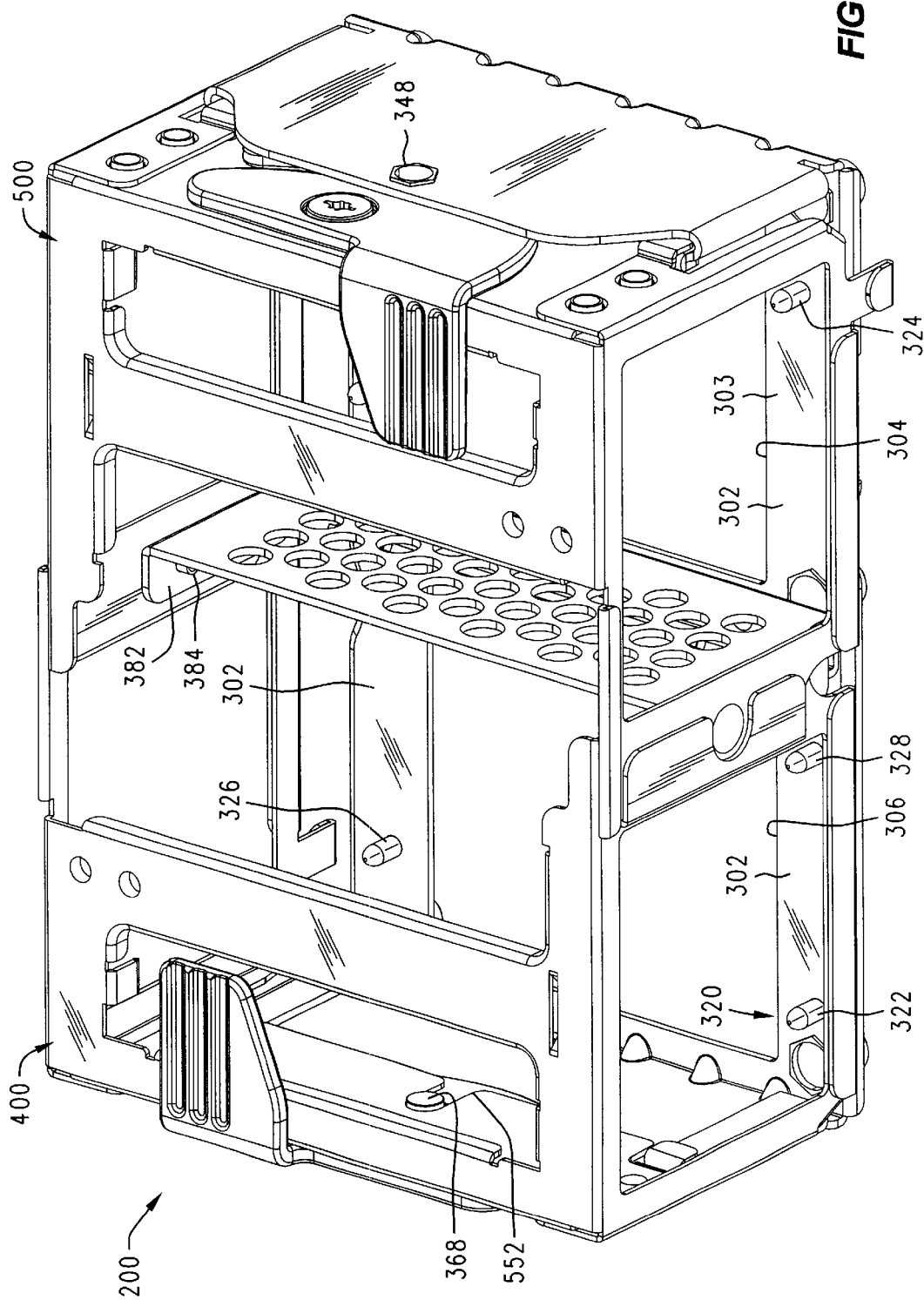
FIG. 4 is top perspective view similar to FIG. 3 but viewed from a different angle.

Referring to FIG. 4, a plurality of electronic unit engagement pins 320, such as the individual electronic unit engagement pins 322, 324, 326, 328, may extend upwardly from the upper surface 303 of the bottom plate 302, as shown, to facilitate the mounting of an electronic unit, such as the electronic unit 100 discussed previously, within the enclosure. More specifically, when an electronic unit is installed within the enclosure 200, the pins 320 may be received within corresponding holes formed, for example, on the electronic unit alignment cage 110, FIG. 7. The pins may be configured and arranged in a specific pattern. In this manner, only an alignment cage 110 having the specific corresponding pattern of holes can be installed within the enclosure 200. Accordingly, the pins 320 may be used to prevent a user from inadvertently installing the wrong type of electronic unit into the enclosure. The pattern of pins within the enclosure 200 may be varied according to the type of electronic unit that is to be installed. The pins 320 may also serve to prevent the alignment cage 110 from moving relative to the enclosure 200 due to sudden physical movement.

With reference, generally, to FIGS. 2–4, the first sidewall 330 of the base assembly 300 may be adjacent the bay 210 and the second sidewall 350 may be adjacent the bay 250. The sidewalls 330, 350 may be substantially parallel to one another and substantially perpendicular to the bottom plate 302. Sidewalls 330, 350 may, for example, be integrally formed with the bottom wall 302 from the sheet metal material mentioned previously.

Sidewalls 330 and 350 may be substantially identical to one another; accordingly, only the sidewall 330 will be described in detail herein. With reference to FIG. 2, sidewall 330 may include a front rounded edge portion 332 formed by rolling the sheet metal about a vertical axis (as viewed in FIG. 2) thus resulting in a space 334 being formed between the sidewall 330 and the rolled over portion of the sheet metal. A second front rounded edge portion 336 may be formed by rolling the sheet metal about a horizontal axis (as viewed in FIG. 2), as shown. Sidewall 330 may also include a rear rounded edge portion 342 similar to the front rounded edge portion 332 described above. More specifically, rear rounded edge portion 342 may formed by rolling the sheet metal about a vertical axis (as viewed in FIG. 2) thus resulting in a space 344 being formed between the sidewall 330 and the rear rolled over portion of the sheet metal. A second rear rounded edge portion 346 may be formed by rolling the sheet metal about a horizontal axis (as viewed in FIG. 2), as shown. A post 348 may be mounted to the sidewall 330 such that it extends from the sidewall toward the first bay 210. The post 348 may, for example, be a substantially cylindrical member formed from steel and may be attached to the sidewall 350, for example, by press-fitting. Post 348 may be substantially identical to the post 368 mounted to the second sidewall 350. The post 368 is more clearly visible in FIG. 4.

Referring again to FIG. 2, central wall 370 may be formed from sheet metal having a thickness, for example, from about 0.032 inch to about 0.090 inch and, preferably, about 0.048 inch. The sheet metal forming the central wall 370 may be bent at right angles about vertical axes (as illustrated in FIG. 2) to form a front flange 372 and a rear flange 382, as shown. The sheet metal may also be bent about a pair of horizontal axes (as illustrated in FIG. 2) to form a generally U-shaped channel 390, as shown. The channel 390 may be attached to the bottom plate 302 in any conventional manner, e.g., by staking or riveting. In this manner, the central wall 370 may be attached to the bottom plate 302. Central wall 370 may include a plurality of holes 392 extending therethrough as shown for the purpose of weight reduction and airflow. Front flange 372 may include a hinge pin 374 and rear flange 382 may include an oppositely disposed hinge pin 384, FIG. 4. Hinge pins 374, 384 may be attached to the respective flanges 372, 382 in any conventional manner. Hinge pins 374, 384 may, for example, take the form of rivets attached to the flanges 372, 382. Together, the hinge pins 374, 384 define a hinge axis "A—A" and serve to hingedly mount the covers 400, 500 to the central wall portion 370 of the base assembly 300 in a manner that will be described in further detail herein.

Covers 400 and 500 may be substantially identical to one another; accordingly, only the cover 500 will be described in detail herein. With reference to FIGS. 2–4, the cover 500 may generally include a front wall 510 and a rear wall 520. A top wall 530 and a side wall 540 may extend between the front and rear walls 510, 520. Front wall 510, rear wall 520, top wall 530 and side wall 540 may, for example, be formed from a single piece of sheet metal having a thickness, for example, of about 0.032 inch. The sheet metal may be bent in various locations in order to add strength and rigidity to the cover structure. The sheet metal forming the front wall 510 may, for example, be bent to form a rounded bottom edge 512 and a rounded top edge 514, as shown. Front wall 510 may also include a tab 516 extending downwardly therefrom (when the cover is in its closed position as shown, for example, in FIG. 3). Tab 516 may include a rounded edge formed by a bend in the sheet metal, as shown. Front wall 510 may further include an aperture, not shown, to facilitate hingedly mounting the cover 500 on the hinge pin 374 of the base assembly central wall 370.

Rear wall 520 may include a rounded bottom edge 522 similar to the front wall bottom edge 512 described previously. In a manner also similar to the front wall 510, rear wall 520 may include an aperture, not shown, to facilitate hingedly mounting the cover 500 on the hinge pin 374 of the base assembly central wall 370.

Top wall 530 may include a hook portion 532 integrally formed, for example, from the sheet metal forming the cover 500. A spring 560 may include a tab portion 562 at one end thereof. Tab portion 562 may be extend through the top wall hook portion 532 as shown, for example, in FIG. 2. The end of the spring 560 opposite the tab portion 562 may be attached to the top wall 530, for example, by stakes or rivets 564, as shown. With the spring 560 mounted to the top wall 530 as described above, the tab portion 562 of the spring 560 is free to move relative to the top wall 530 by sliding beneath the top wall hook portion 532. This freedom of movement, in turn, allows the spring 560 to resiliently compress when a load is applied thereto in a manner that will be described in further detail herein.

Side wall 540 may include a front flange portion 542 folded perpendicularly with respect to the front wall 510 and a rear flange portion 544 folded perpendicularly with respect to the rear wall 520. Front flange portion 542 may be attached, e.g., via stakes or rivets 546, to a wall portion 550 which may be folded perpendicularly with respect to the top wall 530. Rear flange portion 544 may be attached, e.g., via stakes or rivets 548, to the wall portion 550, as shown. Side wall 540 may further include a slot 542 therein, not shown (the slot may be substantially identical to the slot 552 shown on the cover 400 in FIG. 4). Referring again to FIG. 2, a pair of hooks 554, 556 may be located on the side wall 540 as shown and may, for example, be integrally formed from the sheet metal of the sidewall 540.

A locking handle 570 may be rotatably attached to the wall portion 550 of the side wall 540, for example, by a hinge pin 572. Hinge pin 572 may, for example, take the form of a shoulder screw attached to the wall portion 550. Mounted in this manner, the locking handle 570 is rotatable relative to the side wall 540 between a locked position, as illustrated, for example, in FIG. 3, and an unlocked position, as illustrated, for example, in FIG. 2.

Figure 5:
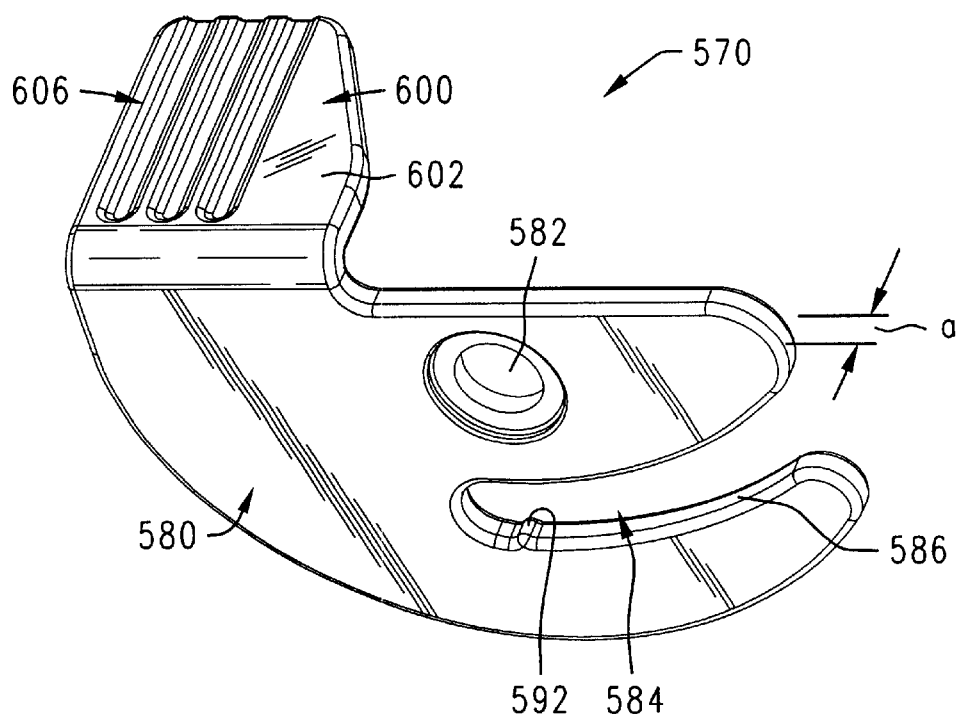
FIG. 5 is a detailed perspective view of an exemplary locking handle useable in conjunction with the enclosure of FIG. 1.
Figure 6:
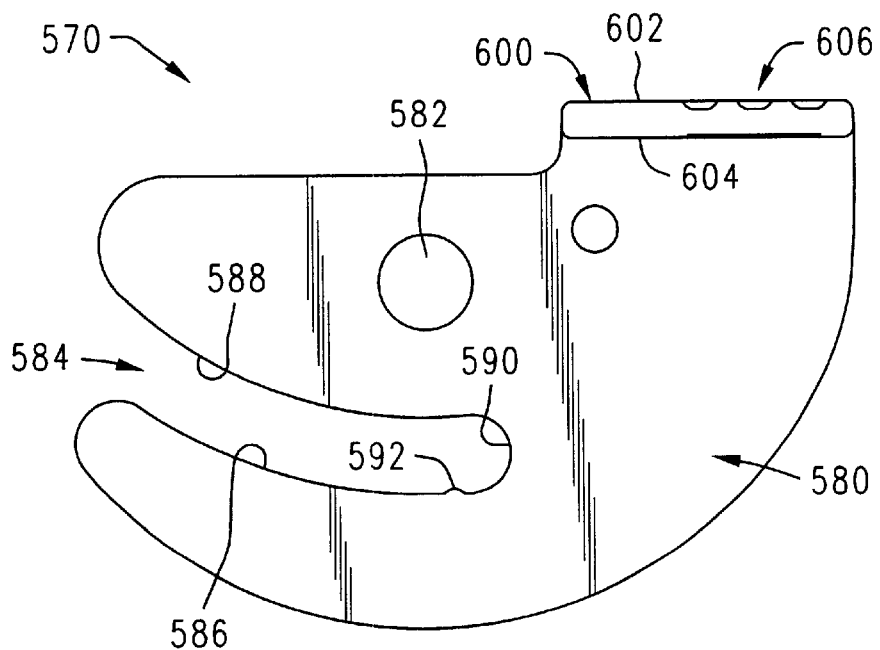
FIG. 6 is front elevational view of the locking handle of FIG. 5.

FIGS. 5 and 6 illustrate the locking handle 570 in further detail and removed from the cover 500. With reference to these drawing figures, the locking handle 570 may, for example, be integrally formed from a plastic material having an exemplary thickness, "a" of from about 0.110 inch to about 0.120 inch. The material used to form the locking handle 570 may, for example, be a plastic material commercially available from General Electric Corporation and sold as "LEXAN 920." Locking handle 570 may generally include a body portion 580 and a handle portion 600 extending substantially perpendicularly from the body portion 580.

Body portion 580 may include a stepped hole 582 for receiving the hinge pin 572, FIG. 2, in a manner as previously described. Body portion 580 may further include an arcuate slot 584 defined at least partially by a first surface 586 and an oppositely disposed second surface 588, FIG. 6. First and second surfaces 586, 588 may be connected to one another by an arcuate surface 590 which may, for example, be in the form of an arc of a circle. A raised detent portion may be provided on the first surface 586, as shown.

Handle portion 600 may include an upper surface 602 and an oppositely disposed lower surface 604, FIG. 6. Indentations forming a textured pattern 606 may be provided on the upper surface 602 of the handle portion 600, as shown.

In use, the enclosure 200 may be mounted to an electronic board, such as the printed circuit board 10, FIG. 1, such that one or more sockets on the circuit board are located within the openings 304, 306 in the enclosure base assembly 300, FIG. 2. More specifically, with reference to FIG. 1, a plate, not shown, may be located on the lower surface of the printed circuit board 10. Bolts or screws may then be passed through openings in the plate and in the printed circuit board 10 and then threaded into the threaded holes in the enclosure foot members 310, FIG. 7. In this manner, the enclosure 200 may be securely mounted to the printed circuit board 10.

Figure 8:
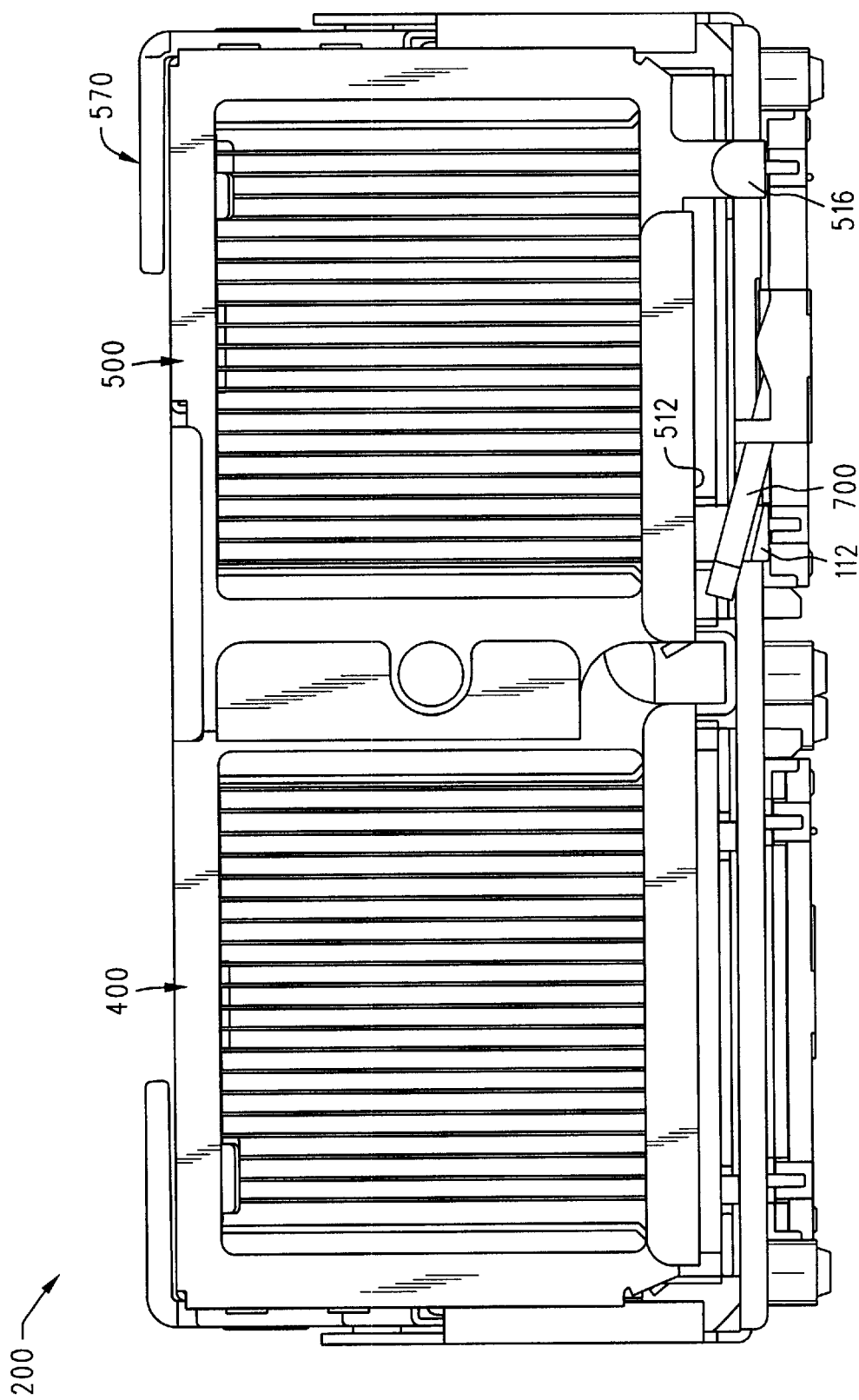
FIG. 8 is a front elevational view of the enclosure of FIG. 1 having electronic units housed therewithin and showing the enclosure in a closed condition.

Once mounted in this manner, the enclosure 200 may be used to aid in the rapid and efficient installation and removal of one or more electronic units with respect to the socket or sockets located within the enclosure openings 304, 306. As noted previously, the electronic unit 100 may interface with a socket on the printed circuit board 10, FIG. 1. Electronic unit 100 may, for example, be mounted to a socket on the printed circuit board 10 such that the pins of the electronic component of the electronic unit 100 will be engaged within corresponding holes in the socket. The configuration of the electronic unit 100 and the socket may, for example, be of the type disclosed in U.S. patent application Ser. No. 10/036, 165, previously referenced. With reference, e.g., to FIG. 7, in this type of confirmation, the socket may include a lever 700 that serves to lock and unlock the electronic component within the socket. With further reference to FIG. 7, the lever 700 may be movable in the directions indicated by the arrow 702 between an unlocked position, as illustrated in FIG. 7, and a locked position, as illustrated in FIG. 8. It is noted that the printed circuit board 10 is omitted from FIGS. 7 and 8 for the purposes of illustrative clarity.

Having described the enclosure 200, an exemplary process of installing an electronic unit, such as the exemplary electronic unit 100 into a socket of a printed circuit board 10 using the enclosure 200 will now be described. As noted previously, the socket may be located within the opening 304 of the enclosure first bay 210, FIG. 2.

To enable initial insertion of the electronic unit 100, the enclosure cover 500 may first be pivoted about the axis A—A, to its fully open position as illustrated, for example, in FIG. 2, to enable the electronic unit 100 to be inserted into the enclosure first bay 210. Also, the locking lever 570 may be pivoted to its open position as also illustrated, for example, in FIG. 2. In this position, the slot 584, FIG. 5, in the locking lever 570 will be substantially aligned with the slot 552, FIG. 4, in the cover sidewall.

In order to properly insert the electronic unit 100 into the socket, the socket lever 700, FIGS. 7 and 8, must be located in its unlocked position, i.e., pivoted to the right as illustrated in FIG. 7. If the locking lever 700 is in the locked position, i.e., pivoted to the left as illustrated in FIG. 8, when the electronic unit 100 is inserted into the bay then the tab 112 on the alignment cage 110, e.g., FIG. 7, will contact the lever 700 as the electronic unit 100 is moved downwardly. This contact, in turn, will prevent further downward movement of the electronic unit 100 and will, thus, prevent a user from attempting to force the electronic unit 100 into a locked socket.

With the locking lever 700 correctly positioned in the unlocked position, i.e., pivoted to the right as illustrated in FIG. 7, the electronic unit 100 may be inserted into the socket of the printed circuit board 10. Thereafter, the locking lever 700, FIG. 7, may be moved from the right-most unlocked position to the left-most locked position as illustrated in FIG. 8 in order to lock the pins of the electronic unit within the socket of the printed circuit board. As can be seen, with reference to FIG. 8, when the lever 700 is in the locked position it may rest against the tab 112 of the alignment cage 110.

Thereafter, the enclosure cover 500 may be moved to a partially closed position by pivoting the cover 500 about the axis A—A, FIG. 2, to the position generally indicated in FIGS. 3, 4 and 8. This movement will cause the post 348, e.g., FIG. 2 to enter both the slot 584 in the locking lever 570, FIG. 5, and the slot 552 in the cover sidewall, FIG. 4.

At this point, the locking handle 570 may be used to move the cover 500 to a fully closed and locked position. More specifically, the locking handle 570 may be rotated to the position shown in FIGS. 3, 4 and 8. Specifically, a user may press on the handle portion 600, FIG. 5, with a finger or thumb to apply a rotary force to the locking handle 570. The exemplary and optional textured pattern 606 may be provided to reduce any tendency for the finger or thumb of the user to slip relative to the handle portion 600 while force is being applied.

Rotating the locking handle 570 in the manner described above will cause the first surface 586 of the locking handle slot 584, FIG. 5, to contact the post 348. This contact, in turn will force the cover 500 to its fully closed position, compressing the spring 560 against the top of the electronic unit 100. As the locking handle 570 is moved to its fully locked position, the post 348 will pass over and be retained by the raised detent portion 592, FIG. 5, of the locking handle slot first surface 586. The raised detent portion 592, thus, may serve to releasably retain the locking handle in its fully closed position.

With reference, for example, to FIGS. 2 and 3, when the locking handle 570 and cover 500 have been moved to their fully closed positions, in a manner as described above, the cover side wall hooks 554, 556, FIG. 2, will enter the base assembly side wall spaces 334, 344, respectively, thus increasing the strength and structural rigidity of the enclosure 200. With reference, for example, to FIG. 8, when the cover 500 has been moved to its fully closed position, the bottom edge 512 of the cover front wall 510 will serve to prevent the locking lever 700 from rotating in a clockwise direction toward the unlocked position.

It is noted that the enclosure 200 may include a feature to prevent the cover 500 from being closed if the locking lever 700 has not first been moved to its locked position. Specifically, as illustrated in FIG. 7, if the locking lever 700 is in the unlocked position (as illustrated in FIG. 7), the tab 516 will contact the lever 700 and prevent the cover 500 from completely closing, thus, informing the user that a problem exists. If, on the other hand, the locking lever 700 is in its locked condition, as illustrated in FIG. 8, then the locking lever 700 will not interfere with the tab 516 and the cover can be moved to its fully closed position in a manner as described above. In this manner, the tab 516 serves to prevent a user from inadvertently closing the cover 500 if the socket lever 700 has not first been moved to its locked position.

As discussed previously, it is generally desirable to apply a downward force to the electronic unit 100 after it is installed within the socket of a printed circuit board. This downward force serves to ensure that the electronic unit remains properly engaged within the socket even in the event of sudden physical movements, e.g., a drop or jar, that might be experienced by the electronic device housing the printed circuit board. The locking handle 570 allows a substantial amount of force to be applied to the electronic unit 100 in a relatively easy manner by a user due to the mechanical advantage afforded by the lever action of the locking handle and the camming interaction between the slot and post. The specific amount of force applied to the electronic unit when the cover is in its closed and locked position may be set, as desired, by appropriately selecting the parameters of the spring 560 (e.g, material thickness, material composition, length). In this manner, the amount of force applied to the electronic unit can readily be selected and controlled, depending upon the dictates of the specific environment in which the electronic unit is installed. The enclosure 200 allows an electronic unit to be installed and removed in a quick and efficient manner without the need for tools.

To remove the electronic unit, the steps outlined above may generally be reversed. First, the locking handle 570 may be rotated in a clockwise direction as viewed, for example, in FIG. 3. To accomplish this, a user may place a finger or thumb beneath the handle portion 600 and in contact with the lower surface 604, FIG. 6. The handle portion 600 may then be lifted upwardly, causing the locking handle 570 to rotate in a clockwise direction. This rotation, in turn, will cause the detent 592 in the slot surface 586 to move past the post 348. Further rotation of the locking handle 570 will then cause the cover 500 to pivot upwardly about the pivot axis A—A, FIG. 2. After the locking handle 570 has been pivoted fully in the clockwise direction, as illustrated, for example, in FIG. 2, the cover 500 may be lifted upwardly causing the post 348 to disengage from the locking handle slot 584, FIG. 6, and the sidewall slot 552, FIG. 4. This movement of the cover 500 may be continued until the cover reaches its fully open position as illustrated, for example, in FIG. 2.

Next, the locking lever 700 may be pivoted from its locked position, as illustrated in FIG. 8 to its unlocked position as illustrated in FIG. 7. With the locking lever 700 moved to its unlocked position, the electronic unit 100 may be disengaged from the printed circuit board socket and lifted out of the bay 201 of the enclosure 200.

It is noted that the specific electronic unit 100 and socket assembly using a lever 700 are described only for exemplary purposes. The enclosure 200 could readily be used in conjunction with any type of electronic unit and any type of socket with or without a locking lever. It is further noted that, if the enclosure 200 is used in conjunction with an interference fit type socket (i.e., a socket without a locking lever), as previously discussed, then the locking handle 570 may also serve to assist a user in applying the necessary downward force required for installation of the electronic unit into the socket.

It is noted although only the enclosure first bay 210 has been described in detail herein, the second bay 250 may be configured and operate in a substantially identical manner such that two electronic units may be mounted on a printed circuit board in a side-by-side configuration as illustrated, for example, in FIG. 8. Alternatively, the enclosure could be configured having only a single bay if it is desired to mount only one electronic unit within the enclosure. As a further alternative, the enclosure could readily include more than two bays if it is desired to mount more than two electronic units within the enclosure.

While an illustrative and presently preferred embodiment has been described in detail herein, it is to be understood that the concepts may be otherwise variously embodied and employed and that the appended claims are intended to be construed to include such variations except insofar as limited by the prior art.

What is claimed is:

1. An assembly comprising:
   an electronic board;
   an enclosure fixedly mounted relative to said electronic board;
   an electronic unit, at least a portion of which is in electrical contact with at least a portion of said electronic board;
   said electronic unit being at least partially located within said enclosure;
   said enclosure comprising a stationary portion and a movable portion that is movable relative to said stationary portion;
   wherein at least one of said stationary portion and said movable portion comprises a post and at least the other of said stationary portion and said movable portion comprises a slot;
   wherein, said assembly comprises at least a first operating condition and a second operating condition;
   wherein, in said first operating condition:
   said post is engaged within said slot;
   said movable portion is applying a force to said electronic unit, urging said electronic unit toward said electronic board; wherein, in said second operating condition:
   said post is disengaged from said slot; and
   said movable portion is not applying a force to said electronic unit; and
   wherein said movable portion further comprises a spring mounted thereto.

2. The assembly of claim 1 wherein, in said second operating condition, said spring is compressed between said movable portion and said electronic unit.

3. The assembly of claim 1 wherein, said electronic unit comprises an electronic component and a heat removal device.

4. The assembly of claim 3 wherein said electronic component comprises a processor.

5. The assembly of claim 1 wherein said slot is formed in a lever and said lever is pivotally attached to said at least the other of said stationary portion and said movable portion.

6. The assembly of claim 5 wherein said lever is pivotally attached to said movable portion and said post is mounted to said stationary portion.

7. The assembly of claim 1 and further wherein:
   said electronic board comprises a locking lever movable between a locked condition and an unlocked condition;
   said moveable portion comprises a tab formed thereon;
   said tab is engageable with said locking lever when said locking lever is in said unlocked condition and said tab is not engageable with said lever when said lever is in said locked condition.

8. A method comprising:
   providing an electronic board;
   providing an enclosure fixedly mounted relative to said electronic board, said enclosure comprising a stationary portion and a movable portion that is movable relative to said stationary portion;
   providing a post on at least one of said stationary portion and said movable portion and providing a slot in the other of said stationary portion and said movable portion;
   locating an electronic unit at least partially within said enclosure and placing at least a portion of said electronic unit in electrical contact with at least a portion of said electronic board;
   causing said moveable portion to apply a force to said electronic unit by engaging said post within said slot; and
   wherein said slot is formed in a lever and said causing said moveable portion to apply a force to said electronic unit comprises rotating said lever.

9. The method of claim 8 and further comprising:
   causing said moveable portion to stop applying a force to said electronic unit by disengaging said post from said slot.

10. The method of claim 8 wherein said causing said moveable portion to apply a force to said electronic unit comprises contacting said electronic unit with a spring attached to said moveable portion.

11. The method of claim 8 wherein said electronic unit comprises an electronic component.

12. The method of claim 11 wherein said electronic component comprises a processor.

13. The method of claim 8 wherein said lever is pivotally attached to said movable portion and said post is mounted to said stationary portion.

14. An assembly comprising:

an electronic board;

an enclosure fixedly mounted relative to said electronic board;

an electronic unit, at least a portion of which is in electrical contact with at least a portion of said electronic board;

said electronic unit being at least partially located within said enclosure;

said enclosure comprising a stationary portion and a movable portion that is movable relative to said stationary portion;

wherein at least one of said stationary portion and said movable portion comprises a post and at least the other of said stationary portion and said movable portion comprises a slot;

wherein, said assembly comprises at least a first operating condition and a second operating condition;

wherein, in said first operating condition:
  said post is engaged within said slot;
  said movable portion is applying a force to said electronic unit, urging said electronic unit toward said electronic board; wherein, in said second operating condition:
  said post is disengaged from said slot;
  said movable portion is not applying a force to said electronic unit; and wherein said slot is formed in a lever and said lever is pivotally attached to said at least the other of said stationary portion and said movable portion.

15. The assembly of claim 14 and further wherein:

said movable portion further comprises a spring mounted thereto; and in said second operating condition, said spring is compressed between said movable portion and said electronic unit.

16. The assembly of claim 14 wherein, said electronic unit comprises an electronic component and a heat removal device.

17. The assembly of claim 16 wherein said electronic component comprises a processor.

18. The assembly of claim 14 wherein said lever is pivotally attached to said movable portion and said post is mounted to said stationary portion.

19. The assembly of claim 14 and further wherein:

said electronic board comprises a locking lever movable between a locked condition and an unlocked condition;

said moveable portion comprises a tab formed thereon;

said tab is engageable with said locking lever when said locking lever is in said unlocked condition and said tab is not engageable with said lever when said lever is in said locked condition.

* * * * *